(12) United States Patent
Harada

(10) Patent No.: US 8,169,052 B2
(45) Date of Patent: May 1, 2012

(54) SEMICONDUCTOR DEVICE

(75) Inventor: Hirofumi Harada, Chiba (JP)

(73) Assignee: Seiko Instruments Inc., Chiba-Shi, Chiba (JP)

( * ) Notice: Subject to any disclaimer, the term of this patent is extended or adjusted under 35 U.S.C. 154(b) by 440 days.

(21) Appl. No.: 12/328,207

(22) Filed: Dec. 4, 2008

(65) Prior Publication Data
US 2009/0152679 A1  Jun. 18, 2009

(30) Foreign Application Priority Data

Dec. 18, 2007 (JP) ................. 2007-326022

(51) Int. Cl.
*H01L 29/72* (2006.01)
(52) U.S. Cl. ......... 257/536; 257/531; 257/538; 257/659
(58) Field of Classification Search ............... 257/531, 257/536, 538, 659
See application file for complete search history.

(56) References Cited

U.S. PATENT DOCUMENTS

| 4,893,158 A | * | 1/1990 | Mihara et al. | ................. 257/341 |
| 2002/0179978 A1 | * | 12/2002 | Sato | ............................... 257/380 |

FOREIGN PATENT DOCUMENTS

JP  2002-76281 A  3/2002

* cited by examiner

*Primary Examiner* — Edward Wojciechowicz
(74) *Attorney, Agent, or Firm* — Brinks Hofer Gilson & Lione

(57) ABSTRACT

A metal electrode is disposed on each of a plurality of resistor groups which are made of polycrystalline silicon resistors and constitute a resistor circuit. The metal electrode is connected to an end of the resistor via another interconnecting layer. Accordingly, the external influence which the metal electrode receives during a semiconductor manufacturing process is prevented from directly acting on the resistor, whereby resistance variation is suppressed.

1 Claim, 6 Drawing Sheets

SEMICONDUCTOR DEVICE

RELATED APPLICATIONS

This application claims priority under 35 U.S.C. §119 to Japanese Patent Application No. JP2007-326022 filed on Dec. 18, 2007, the entire content of which is hereby incorporated by reference.

BACKGROUND OF THE INVENTION

1. Field of the Invention

The present invention relates to a semiconductor device including a resistor circuit made of polycrystalline silicon.

2. Description of the Related Art

In a semiconductor integrated circuit a diffusion layer resistor, which is made from a single crystalline silicon semiconductor substrate to which impurities of an opposite conductivity to the semiconductor substrate conductivity are introduced, and a polycrystalline silicon resistor, which is made of polycrystalline silicon to which impurities are introduced, are used. Of these, the polycrystalline silicon resistor is widely used in the semiconductor integrated circuit because of its advantages in, for example, a small leakage current due to an insulating film surrounding the resistor and in realization of a high resistance owing to defects existing at grain boundaries.

FIGS. 2A and 2B show a schematic plan view and a schematic cross-sectional view of a conventional polycrystalline silicon resistor circuit.

The polycrystalline silicon resistor is manufactured by introducing p-type or n-type impurities into a polycrystalline silicon thin film deposited on an insulating film by low pressure chemical vapor deposition (LPCVD) or the like, and then forming the resultant into a resistor shape by a photolithography technique. Impurity introduction is carried out to determine a resistivity of the polycrystalline silicon resistor. P-type impurities such as boron or $BF_2$, or n-type impurities such as phosphorus or arsenic are introduced at a concentration ranging from $1 \times 10^{17}/cm^3$ to $1 \times 10^{20}/cm^3$ depending on a desired resistivity. Further, each terminal on both ends of the resistor is formed by a contact hole and metal line to pick up a potential thereof. In order to obtain a satisfactory ohmic contact between the polycrystalline silicon and the metal line at the terminal, impurities at a high concentration of $1 \times 10^{20}/cm^3$ or more are introduced into a part of the polycrystalline silicon corresponding to the terminal of the resistor.

Accordingly to construct a resistor circuit including resistor groups 201 to 204 illustrated in FIG. 3, the resistor 3 using the polycrystalline silicon is formed on an insulating film 2 disposed on a semiconductor substrate 1, and is including a low concentration impurity region 4 and a high concentration impurity region 5 as illustrated in the schematic plan view of FIG. 2A and the schematic cross-sectional view of FIG. 2B. A potential of each of terminals A (101) to E (105) is picked up by metal line 7 through a contact hole 6 provided on the high concentration impurity region 5. Further, in a case where various potentials are picked up from the resistor circuit, the resistor groups 1 (201) to 4 (204) are selected from resistor groups having various structures obtained by connecting a unit resistor in series or in parallel. Then, in order to stabilize a resistance for each resistor group, a metal portion is formed on the resistor group and connected to a terminal at an end of the resistor group. There are two reasons for the structure.

The first reason is to obtain a stability of the polycrystalline silicon resistor. Since the polycrystalline silicon is a semiconductor, formation of a metal line or an electrode causes depletion or accumulation of the polycrystalline silicon owing to a relative relationship between a potential of the metal line or the electrode and a potential of the polycrystalline silicon resistor, which changes the resistance of the polycrystalline silicon resistor. Specifically, presence of a metal line or an electrode having a higher potential than that of the polycrystalline silicon resistor directly above the polycrystalline silicon, into which the p-type impurities are introduced, causes the depletion of the p-type polycrystalline silicon, increasing the resistance of the polycrystalline silicon resistor. In a case of a reverse potential relationship, the resistance thereof is reduced owing to the accumulation. In order to avoid the resistance variation described above, a metal line having a potential close to that of the polycrystalline silicon is intentionally formed on the polycrystalline silicon, whereby a constant resistance can be maintained, which is illustrated in the schematic plan view of FIG. 2A as an example. In FIG. 2A, an electrode on one side of the polycrystalline silicon resistor is extended up to a resistor to fix the potential.

This phenomenon depends not only on the metal line above the polycrystalline silicon but naturally also on the metal line below the polycrystalline silicon. In other words, a relative relationship between potentials of the polycrystalline silicon resistor and a semiconductor substrate located below the polycrystalline silicon resistor varies the resistance. In view of this, there is known a method of stabilizing the potential by intentionally forming a diffusion region (not shown) or the like below the polycrystalline silicon resistor similar to the above-mentioned metal line.

The second reason is to prevent diffusion of hydrogen, which affects the resistance of the polycrystalline silicon, into the polycrystalline silicon in a semiconductor manufacturing process. The polycrystalline silicon includes a grain having relatively high crystallinity and a grain boundary between the grains which has low crystallinity, that is, a high level density. The resistance of the polycrystalline silicon resistor is mostly determined by electrons or holes serving as carriers which are trapped by a large number of levels existing at the grain boundary. Accordingly, generation of hydrogen having a high diffusion coefficient occurs in a semiconductor manufacturing process, the generated hydrogen easily reaches the polycrystalline silicon and becomes trapped by the level, which varies the resistance.

Examples of the hydrogen generating process described above include a sintering step in a hydrogen atmosphere after metal electrode formation and a formation step for a plasma nitride film using an ammonia gas. When the metal line covers the polycrystalline silicon resistor, the resistance variation of the polycrystalline silicon due to the hydrogen diffusion can be suppressed. The method of stably providing the resistance of the polycrystalline silicon is disclosed in, for example, JP 2002-076281 A.

The conventional method of stabilizing the resistance of the polycrystalline silicon as described above has, however, the following problem. Specifically, the metal portion on the polycrystalline silicon is susceptible and receives effects caused by, for example, heat, stress, and charge due to plasma, other than hydrogen which affect the polycrystalline silicon in the semiconductor manufacturing process. Accordingly these effects operate on the polycrystalline silicon through the metal portion thereon, resulting in the resistance variation.

SUMMARY OF THE INVENTION

In order to solve the above-mentioned problem, the present invention is structured as follows.

1. A semiconductor device including: a semiconductor substrate; a first insulating film formed on the semiconductor substrate; a resistor formed on the first insulating film and made of polycrystalline silicon including a low concentration impurity region and a high concentration impurity region; a metal line layer formed away from a plurality of the resistors made of the polycrystalline silicon; a second insulating film formed on the resistor and the metal line layer; a metal line for connecting a contact hole on the high concentration impurity region of the resistor and a first contact hole on the metal line layer, the contact hole and the first contact hole being formed in the second insulating film; and metal line for covering the low concentration impurity region of the resistor to be connected to a second contact hole on the metal line layer.

2. A semiconductor device including: a semiconductor substrate; a first insulating film formed on the semiconductor substrate; a resistor formed on the first insulating film and made of polycrystalline silicon including a low concentration impurity region and a high concentration impurity region; a second insulating film formed on the resistor; a first metal line formed on the second insulating film to cover the low concentration impurity region of the resistor; a second metal line formed on the second insulating film to be connected to a contact hole provided on the high concentration impurity region of the resistor; a third insulating film formed on the first metal line and the second metal line; and a third metal line formed on the third insulating film, in which the first metal line and the third metal line are connected to each other via a through hole provided in the third insulating film, and the second metal line and the third metal line are connected to each other via another through hole provided in the third insulating film.

According to the present invention, it is possible to provide a semiconductor device including a resistor circuit formed of polycrystalline silicon resistors which are less likely to fluctuate due to the influence of the semiconductor manufacturing steps and which are stable because of small resistance variation.

DETAILED DESCRIPTION OF THE PREFERRED EMBODIMENTS

Hereinafter, with reference to the drawings, embodiments of the present invention are described.

Figure 1:
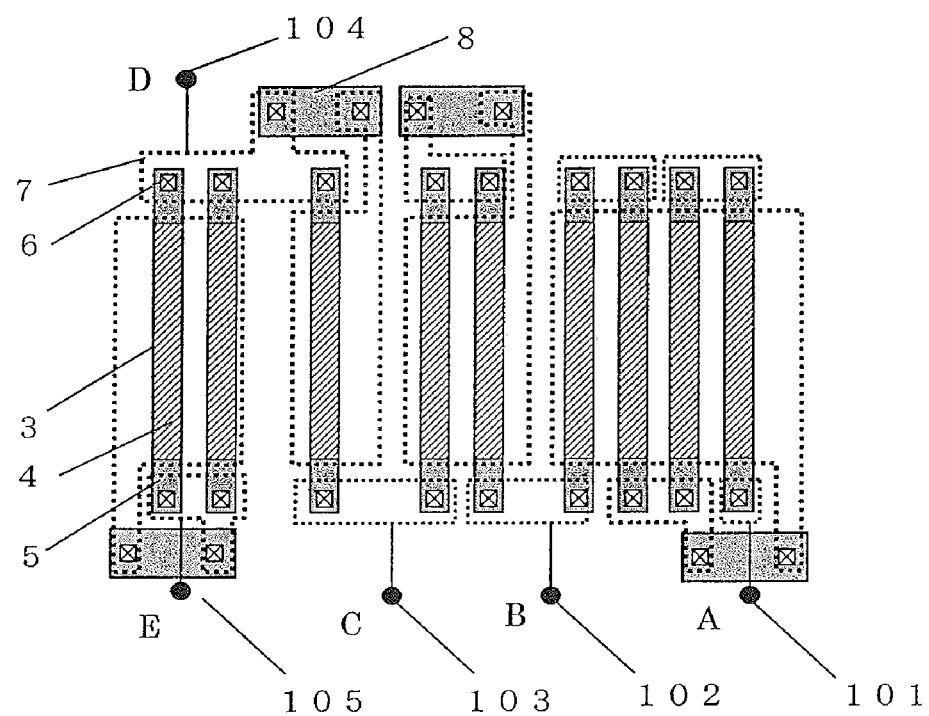
FIG. 1 is a schematic plan view of a polycrystalline silicon resistor circuit according to an embodiment mode of the present invention.
Figure 3:
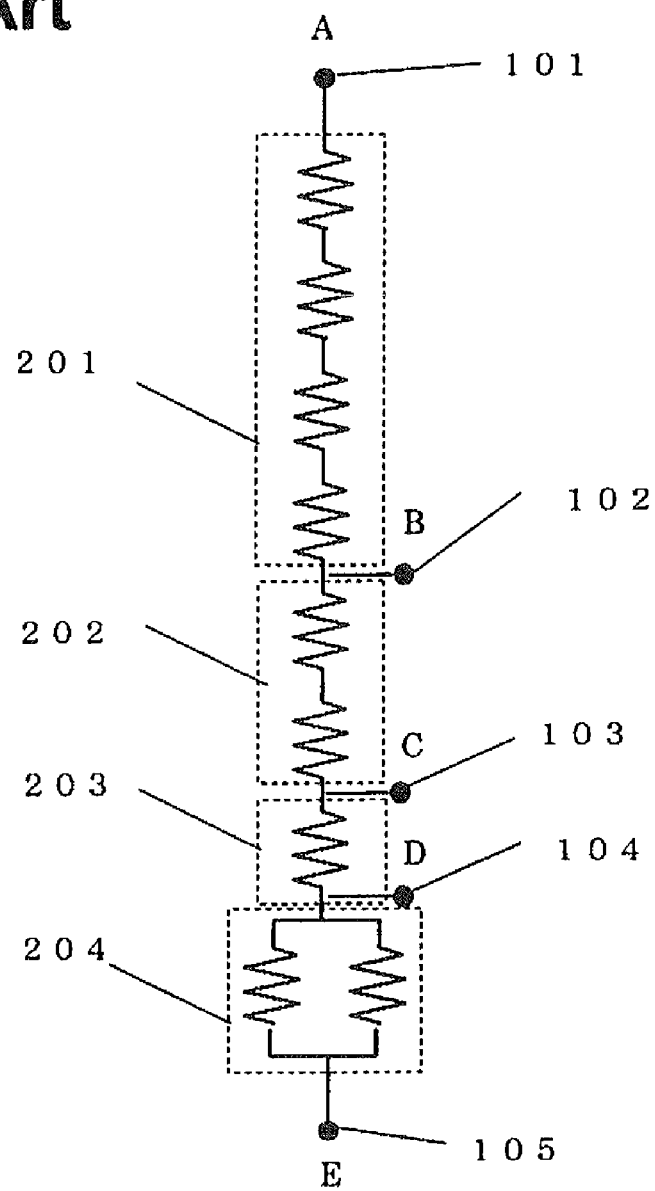
FIG. 3 is an example of a circuit diagram of a resistor circuit.

FIG. 1 is a schematic plan view illustrating an embodiment of the present invention for realizing a resistor circuit illustrated in FIG. 3. Each of resistor groups 1 (201) to 4 (204) is formed of polycrystalline silicon 3 including a low concentration impurity region 4 and a high concentration impurity region 5, which is formed on an insulating film 2 on a semiconductor substrate 1, as in a conventional example. Through a contact hole 6 provided on the high concentration impurity region 5, a potential of each of terminals A (101) to E (105) is taken out by metal line 7.

Figure 2A:
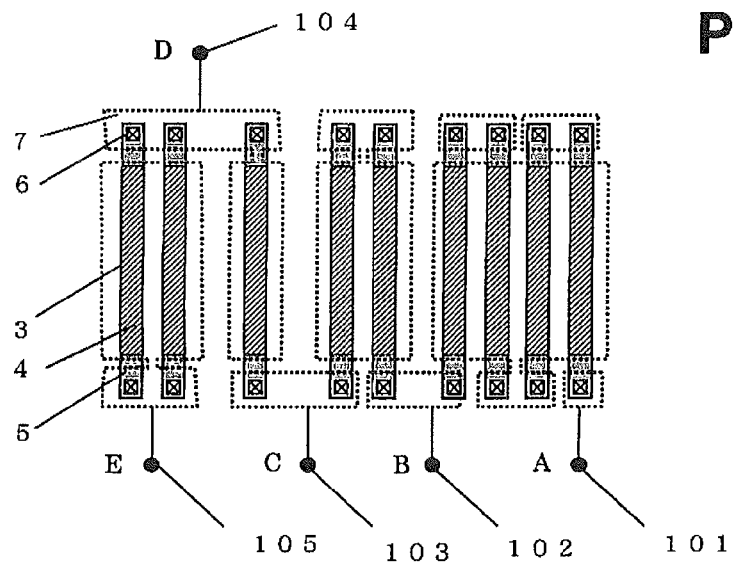
FIG. 2A is a schematic plan view of a conventional polycrystalline silicon resistor circuit.
Figure 2B:
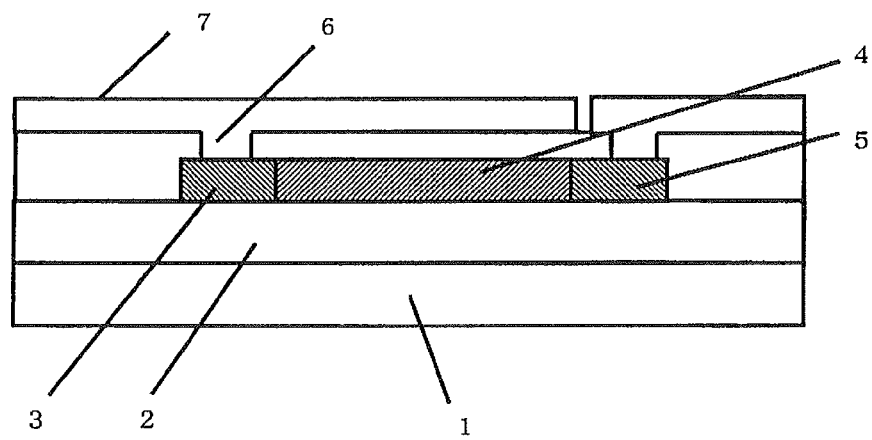
FIG. 2B is a schematic cross-sectional view of the conventional polycrystalline silicon resistor circuit.

In the conventional example the metal line 7 is extended so as to cover the low concentration impurity region 4 of a resistor as illustrated in FIGS. 2A and 2B. This is because, as described previously, a potential of the resistor and that of metal which covers the resistor are set equal to each other to thereby stabilize the resistance. In this regard, the present invention has a structure in which the metal which covers the low concentration impurity region of the resistor is brought into contact with one end of another interconnecting layer once and another end of the another interconnecting layer is connected to one end of the resistor with the metal line again. The feature of the present invention resides in the provision of an interconnecting layer 8 as described above. In other words, the metal which covers the resistor and one terminal of the resistor are indirectly connected to each other via the interconnecting layer 8, and hence a potential of the metal which covers the resistor has the same value as that of the resistor. The resistance variation due to the potential difference is suppressed as in the conventional example, but the present invention is configured so that the metal which covers the resistor is not directly connected to the one terminal of the resistor. The metal which covers the resistor is not directly connected to the terminals of the resistor to stabilize the resistance of the resistor.

The metal line formed by the semiconductor manufacturing process receives various influences during the process. For example, heat is applied during sputtering when the metal is formed by sputtering method, and even if the application of additional heat is not intended, generated heat is applied during the sputtering process. Further, the influences include physical damage or stress imparted during sputtering or in a subsequent formation process of the metal line, and electric charges generated by plasma processing and the like. The above-mentioned heat or stress applied to the metal line and the generated electric charges have an influence not only to the metal but also to a substance contacting with the metal. For example, as in the conventional example illustrated in FIGS. 2A and 2B, where the metal which covers the resistor is connected to one end of the resistor, the heat, stress, charge, and the like gathered through an area having several tens μm by several tens μm are easily transmitted also to the connected resistor, having an effect of changing a grain boundary density of the resistor and trapping the charge, which leads to variation in the resistance of the resistor. Accordingly, the conventional structure cannot suppress the influence of disturbance noise which affects the metal line during the process though it exhibits a great effect in the suppression of the resistance variation based on the relative relationship of the potentials around the resistor, resulting in the resistance variation.

In the present invention, the metal line is not directly connected to the resistor, and hence the influence of the disturbance noise which affects the metal line during the process does not reach the resistor immediately, which has an effect of relieving the influence by other metal line. Accordingly, the resistance variation due to the disturbance noise can be suppressed. Further, since a connection destination of the metal line is not changed, the metal line is not affected by the influence of the resistance variation based on the relative relationship of the potentials around the resistor.

Hereinafter, specific embodiments to which the present invention is applied are described.

Figure 4:
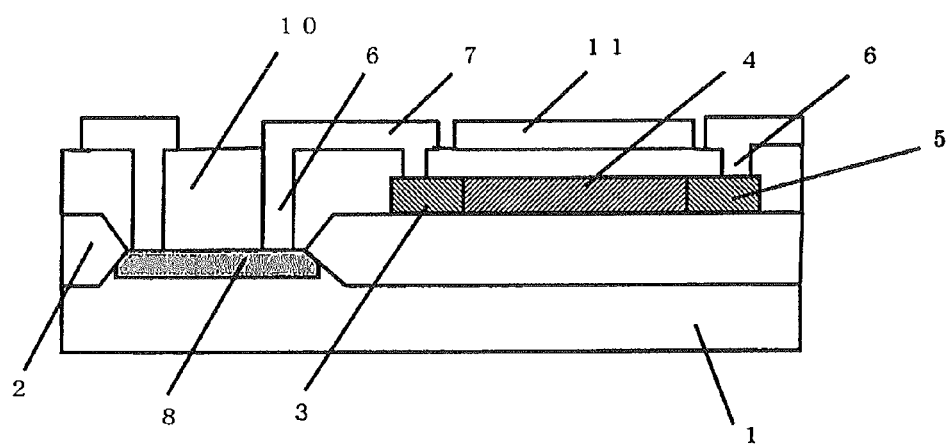
FIG. 4 is a cross-sectional view illustrating a main portion of a polycrystalline silicon resistor circuit according to a first embodiment of the present invention.

FIG. 4 is a cross-sectional view of a main portion illustrating a first embodiment of the present invention for realizing the resistor circuit of FIG. 3. In this embodiment, an interconnecting layer 8 which serves to connect a resistor 3 and a metal portion 11 is formed of an impurity diffusion layer formed in a semiconductor substrate 1. The impurity diffusion layer is configured so that impurities having a polarity opposite to a polarity of the semiconductor substrate 1 are selected, and a leak current does not flow excessively in the semiconductor substrate 1 when voltage is applied to the resistor circuit. Further, an impurity implantation dose is selected according to voltage applied to the resistor circuit so that a diode including the semiconductor substrate 1 and the impurity diffusion layer does not cause junction breakdown due to the voltage application.

A resistor 3 formed of polycrystalline silicon including a low concentration impurity region 4 and high concentration impurity regions 5 at both ends is disposed on a first insulating film 2 formed on a semiconductor substrate 1. A metal portion 11 is disposed over the resistor through a second insulating layer 10. A metal line 7 connects the high concentration impurity region 5 and the interconnection layer 8, which is an impurity diffusion layer formed on the surface of the substrate near the resistor, through contact holes 6 provided on each of the high concentration impurity region 5 and the interconnection layer 8 in the second insulating layer 10.

Figure 5:
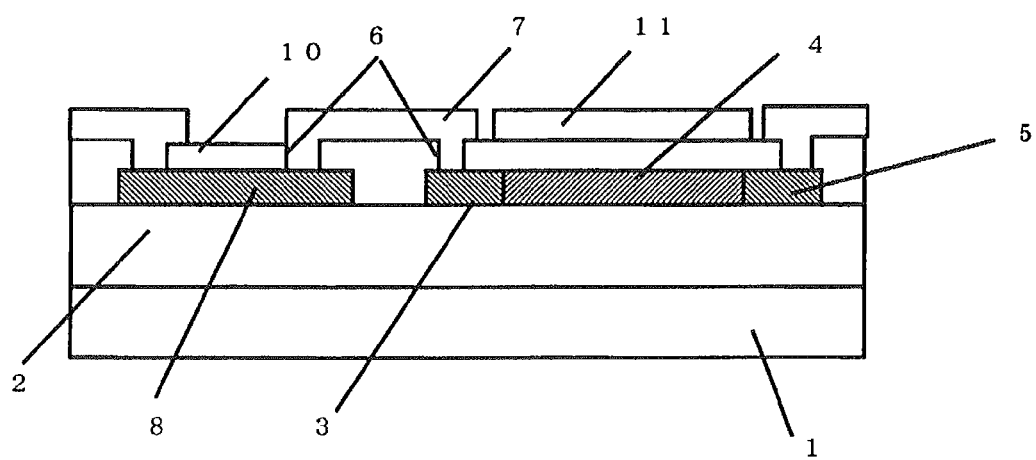
FIG. 5 is a cross-sectional view illustrating a main portion of a polycrystalline silicon resistor circuit according to a second embodiment of the present invention.

FIG. 5 is a cross-sectional view of a main portion illustrating a second embodiment of the present invention for realizing the resistor circuit of FIG. 3. In this embodiment, an interconnecting layer for connecting a polycrystalline silicon resistor 3 and a metal portion 11 is made of polycrystalline silicon which is also used in the resistor. In this case, an additional step such as preparing an extra metal line layer is unnecessary, and providing a layout margin for alignment shift among different metal line layers is also unnecessary, resulting in requirement for a smaller area. In other words, the embodiment can cope with cost reduction, which is a great feature thereof. With regard to the disturbance noise, the resistance variation due to heat or charge is absorbed in the interconnecting layer 8 made of polycrystalline silicon to thereby suppress its transmission to the resistor. Even the occurrence of the resistance variation in the interconnecting layer 8 due to the influence of the disturbance noise does no harm to the circuit operation since any consideration for the resistance variation is originally not needed to this part of the interconnecting line.

Figure 6:
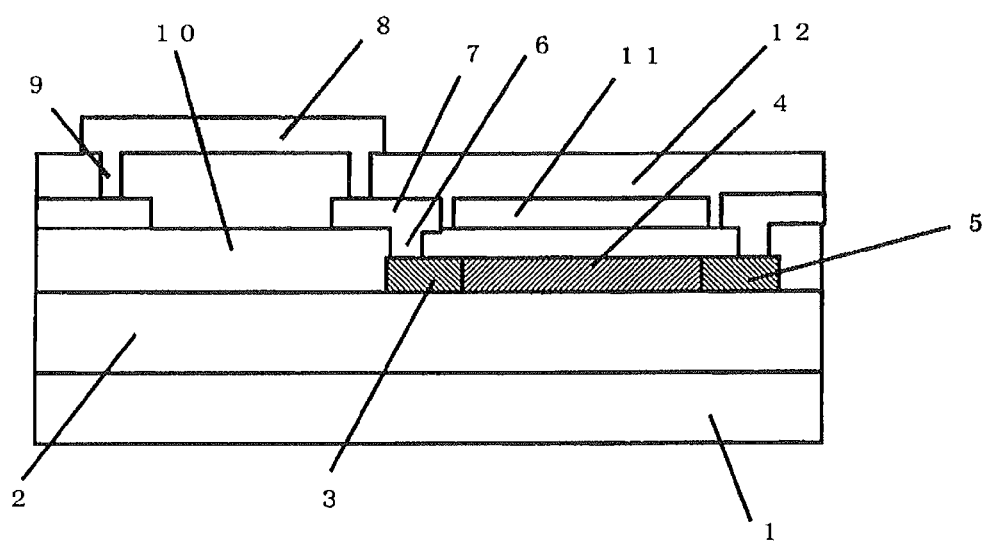
FIG. 6 is a cross-sectional view illustrating a main portion of a polycrystalline silicon resistor circuit according to a third embodiment of the present invention.

FIG. 6 is a cross-sectional view of a main portion according to a third embodiment of the present invention for realizing the resistor circuit of FIG. 3. In this embodiment, it is assumed that a multi-layer metal line process is employed, in which an interconnecting layer 8 for connecting a polycrystalline resistor 3 and a metal portion 11, provided as a first metal line, is formed of a second metal line provided on a third insulating film 12 above the metal line 7 and the metal portion 11 which covers the resistor. As a result, just after formation of the metal portion 11 which covers the resistor, the metal portion 11 is not connected to anywhere and is in an electrically floating state, which has the advantage of causing no effect to the resistor immediately. Even when electric charges are accumulated in the metal line 7 including the metal portion 11 and are retained until the interconnecting layer 8 formed of upper layer metal line is formed, the charges are dissipated from the semiconductor substrate 1 or the stage electrically connected at a step of depositing metal for the upper layer metal line on the entire surface of a wafer by sputtering, and hence does not affect the resistor.

The adoption of the embodiments described above can suppress the influence of disturbance noise in the semiconductor manufacturing process, and provide a resistor circuit formed of stable resistors having small resistance variation. Further, embodiments of the present invention can be obtained by merely inserting an interconnecting layer into a circuitry between the resistor and the metal formed so as to cover the resistor. As a matter of course, the effect of suppressing the resistance variation due to depletion or accumulation effect of the resistor is not impaired.

In the above-mentioned embodiments of the present invention, the description has been given to the resistor made of the polycrystalline silicon which includes the low concentration impurity region and the high concentration impurity region. However, it is apparent that the present invention can be similarly conducted even when a resistor made of polycrystalline silicon having an entirely uniform impurity concentration. In addition, it is apparent that the use of the interconnecting layer is not limited to connect metal lines and also includes usage in ordinary wiring.

What is claimed is:

1. A semiconductor device, comprising:
    a semiconductor substrate;
    a first insulating film disposed on the semiconductor substrate;
    a resistor disposed on the first insulating film and made of polycrystalline silicon including a low concentration impurity region and a high concentration impurity region;
    a second insulating film disposed on the resistor;
    a first metal line disposed on the second insulating film to cover the low concentration impurity region of the resistor;
    a second metal line disposed on the second insulating film and connected to the high concentration impurity region of the resistor via a first contact hole;
    a third insulating film disposed on the first metal line and the second metal line; and
    a third metal line disposed on the third insulating film, the second metal line and the third metal line being connected to each other via another through a second contact hole provided in the third insulating film, wherein the first metal line is not directly connected to the resistor, thereby suppressing disturbance noise affecting the first metal line and the second metal line.

* * * * *